United States Patent [19]

Lehmann

[11] Patent Number: 4,825,272
[45] Date of Patent: Apr. 25, 1989

[54] SEMICONDUCTOR POWER SWITCH WITH THYRISTOR

[75] Inventor: Erhard Lehmann, Aschheim, Fed. Rep. of Germany

[73] Assignee: Siemens Aktiengesellschaft, Berlin and Munich, Fed. Rep. of Germany

[21] Appl. No.: 98,778

[22] Filed: Sep. 17, 1987

Related U.S. Application Data

[63] Continuation of Ser. No. 753,200, Jul. 9, 1985, abandoned.

[30] Foreign Application Priority Data

Jul. 12, 1984 [DE] Fed. Rep. of Germany ....... 3425719

[51] Int. Cl.$^4$ ............................................. H01L 29/74
[52] U.S. Cl. ........................................ 357/38; 357/39; 357/55; 357/64; 307/637; 307/642; 307/319
[58] Field of Search ................. 307/642, 637, 317 R, 307/319, 631; 357/38, 39, 64, 55, 56

[56] References Cited

U.S. PATENT DOCUMENTS

| | | | |
|---|---|---|---|
| 3,324,359 | 6/1967 | Gentry | 357/38 |
| 3,391,310 | 7/1968 | Gentry | 357/39 |
| 3,437,889 | 4/1969 | Eugster | 357/39 |
| 3,468,729 | 9/1969 | Bentley et al. | 357/39 |
| 3,488,522 | 1/1970 | Cameron et al. | 307/637 |
| 3,509,382 | 4/1970 | Zgebura | 307/637 |
| 4,079,407 | 3/1978 | Hutson | 357/39 |
| 4,236,169 | 11/1980 | Nakashima et al. | 357/39 |
| 4,313,128 | 1/1982 | Schlegez | 357/39 |
| 4,357,621 | 11/1982 | Takeuchi et al. | 357/39 |

FOREIGN PATENT DOCUMENTS

| | | |
|---|---|---|
| 0075945 | 4/1983 | European Pat. Off. |
| 2447621 | 4/1975 | Fed. Rep. of Germany |
| 2412169 | 7/1979 | France |

OTHER PUBLICATIONS

Standard Search Report, File RS 75317 DE, 13.05.1986.
IEEE Transaction on Electron Devices, ED-31, No. 6, Jun. 1984; "The Influence of Surface Charge and Bevel Angle on the Blocking Behavior of a High-Voltage $p^+$-n-$n^+$ Device," Brieger et al.

Primary Examiner—Joseph E. Clawson, Jr.
Attorney, Agent, or Firm—Adel A. Ahmed

[57] ABSTRACT

A power switch device comprises an asymmetrically blocking thyristor (ASCR), with which a diode is connected in series. The ASCR as well as the diode require only about one half the central zone thickness as compared with a symmetrically blocking thyristor laid out for the same blocking voltage in reverse direction ($U_{RRM}$). For the series connection of the ASCR and diode, this results in a much lower blocking delay charge ($Q_{rr}$).

14 Claims, 1 Drawing Sheet

SEMICONDUCTOR POWER SWITCH WITH THYRISTOR

CROSS-REFERENCE TO RELATED APPLICATION

This is a continuation of Ser. No. 753,200 filed July 9, 1985 now abandoned.

BACKGROUND OF THE INVENTION

The present invention relates to semiconductor power switch devices including thyristors, and, more specifically, such devices utilizing serial combinations of thyristors and diodes.

Conventional power switches generally employ symmetrically blocking thyristors with the zone sequence $n^+pnp^+$. A symmetrically blocking thyristor is defined as a thyristor that can block voltages of at least approximately the same magnitude in the on-state as well as in the off-state direction. In the conducting state, the weakly doped central zones of the thyristor are swamped with charge carriers. If such a thyristor is blocked at that time, the carriers stored in the interior of the semiconductor body of the thyristor must be swept out. After the charge is swept out, the thyristor is able to withstand its blocking voltage. For this reason, the charge is called the reverse recovery charge $Q_{rr}$ and is a characteristic parameter of every thyristor. The value of the parameter depends essentially on the thickness of the central zone, i.e. on the maximum possible blocking voltage and is proportional approximately to the square of the thickness of the central zone. The quantity $Q_{rr}$ therefore increases at a greater rate than directly proportionally with increasing maximum blocking voltage.

The result of the stored charge is that immediately after current crossover the thyristor cannot block yet. A return current will therefore continue to flow through the thyristor until the charge carriers have been approximately cleared from the central zone. At approximately at the peak of the return current, the thyristor starts to receive the blocking voltage. When such thyristors are operated with inductive loads, a voltage which places the thyristor under stress in the blocking direction will build up at the inductance. The magnitude of this voltage is determined by the magnitude of the return current and hence by the magnitude of the reverse recovery charge as well as by the circuit parameters including the R-C effect of the wiring.

It would indeed be possible to reduce the storage charge by weaker doping of the outer zones of the thyristor. But then as a consequence, the conducting-state voltage of the thyristor increases and the power dissipation in the thyristor also rises.

It is an object of this invention to provide a semiconductor power switch device of the thyristor type in such a way that at a given blocking voltage the blocking delay charge and hence also the recovery time is reduced without increasing the conducting-state voltage $U_T$.

SUMMARY OF THE INVENTION

The invention broadly takes the form of an asymmetrically blocking thyristor including a serially connected diode.

By an asymmetrically blocking thyristor is to be understood that the thyristor essentially is able to receive blocking voltage $U_{DRM}$ only in the forward direction. In the backward direction, the asymmetrical thyristor can receive only a much lower blocking voltage of some 10V.

As illustrative embodiment comprises an auxiliary diode being connected antiparallel to the asymmetrical thyristor. According to an aspect of the invention, the auxiliary diode is integrated into the semiconductor body of the thyristor device. In another aspect of the invention, the original diode is designed so that it has a higher blocking delay stored therein than in the thyristor device. Other aspects of the invention involve specific configurations of the physical geometry of the device structure used to advantage.

BRIEF DESCRIPTION OF THE INVENTION

The foregoing and other features and advantages of this invention will be more fully understood from the following description of illustrative embodiments in conjunction with the drawing.

The invention is described more specifically with reference to two illustrative embodiments in connection with FIGS. 1, 2 and 4, 5. In the drawing:

FIG. 1 illustrates a circuit diagram of a first embodiment;

FIG. 2 presents a circuit diagram of another illustrative embodiment;

FIG. 3 is a schematic section taken through an asymmetrically blocking thyristor; and FIGS. 4 and 5 are each a side view of a semiconductor unit, wherein each comprises the semiconductor elements of an asymmetrical thyristor and diode.

DETAILED DESCRIPTION

Figure 1:
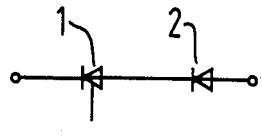
Figure 3:
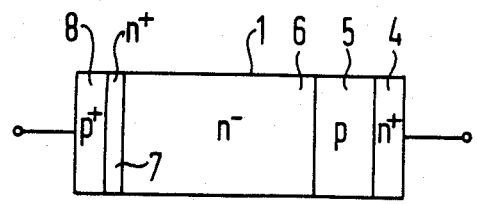

In FIG. 1, the semiconductor power switch includes an asymmetrically blocking thyristor 1 and a diode 2 connected in series with thyristor 1. The diode 2 may be connected in series, as shown, with the thyristor 1 on the anode or cathode side. The construction of the asymmetrically blocking thyristor 1 is indicated schematically in FIG. 3. It comprises two highly doped outer zones 4 and 8, which are strongly n- or respectively strongly p- doped. Next to the strongly doped outer zone 4 is a more weakly p-doped zone 5. Next to zone 5 is a weakly n-doped zone 6. Compared with all other zones, the latter has the greatest thickness. Between the weakly n-doped zone 6 and the strongly p-doped zone 8 lies a so-called stop layer 7, which is strongly n-doped. This zone 7 corresponds to about the space charge zone of thyristor 1 can expand starting from the pn junction between the zones 5 and 6 into zone 7. Thus this results in a first approximation, because of the more favorable field pattern in zone 6, a doubling of the blocking voltage in the forward direction $U_{DRM}$ is obtained as compared with a symmetrically blocking thyristor with equal thickness of the weakly n-doped zone.

Similar conditions with regard to the asymmetrically blocking thyristor result for a diode, since the latter generally has a zone sequence $P^+pn^-n^+$. Hence also a diode requires only about half the width of the weakly doped central zone as a symmetrically blocking thyristor of equal blocking voltage. Since, as has been mentioned in the foregoing, the blocking delay charge is approximately proportional to the square of the thickness of the weakly doped central zone, there results for the semiconductor power switch according to FIG. 1 in first approximation a storage charge one fourth as great as for a symmetrically blocking thyristor of equal blocking voltage. With a rating to equal reverse recovery charge, the conducting-state voltage of the semiconductor power switch according to FIG. 1 is lower than the conducting-stage voltage of a symmetrically blocking thyristor of equal blocking voltage. This is due to the fact that a diode, compared with a thyristor of equal blocking voltage and equal active surface, shows a lower conducting-state resistance. A semiconductor power switch with symmetrical blocking properties is obtained when the blocking voltage is the forward direction $U_{DRM}$ of the thyristor 1 which is equal to the blocking voltage in the backward direction $U_{RRM}$ of diode 2.

Figure 2:
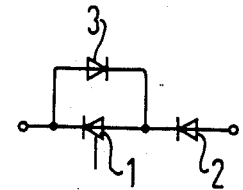

If a power switch according to FIG. 1 is operated in current converters, e.g. in d-c choppers, thyristor 1 is loaded with return current, which means that the thyristor goes into avalanche breakdown. Since not every ASCR is equally well suited for this operation—for example a distinct recovery time increase may occur—preferably one connects the thyristor 1 antiparallel with a diode 3, as shown in FIG. 2. The return current then flows through the antiparallel-connected auxiliary diode 3 and avoids a higher blocking load of the ASCR.

It is advisable to rate the diode 2 so that its reverse recovery charge $Q_{rr}$ is greater than that of the thyristor 1. In that case the thyristor can be swept out quickly. If the blocking delay charge of the diode is smaller than that of the thyristor, the charge carriers in the thyristor must, after completed clearing of the diode, disappear by recombination, which amounts to an increase of the recovery time.

Figure 4:
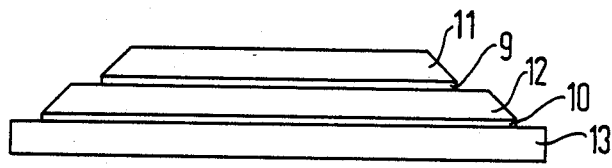

The switches according to FIGS. 1 and 2 may be constructed with discrete components. However, it is possible for example to integrate the auxiliary diode 3 into the semiconductor body of thyristor 1. Such thyristors are known as reverse-conducting thyristors (RLT). Also it is possible to combine the semiconductor bodies of thyristor 1 and diode 2 as a unit. A first possibility is illustrated in FIG. 4. Here the semiconductor body of thyristor 1 is marked 11, the semiconductor body of diode 2 is marked 12. The semiconductor bodies 11 and 12 may be joined by an alloy layer 9. Appropriately then the anode side of semiconductor body 11 of the thyristor is contiguous to the cathode side of the semiconductor body 12 of anode 2. The unit is reinforced by a support disk 13, which is connected with the unit by an alloy layer 10. The support disk 13 may be fabricated from suitable conventional materials such as molybdenum or tungsten.

Figure 5:
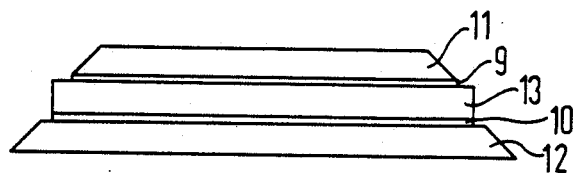

It is possible also to alloy the semiconductor bodies 11 and 12 to the support disk 13 on both sides, as shown in FIG. 5. Here, too, the semiconductor body 11 of thyristor 1 is appropriately alloyed with the anode side to the support plate 13, since the cathode side generally contains the gate structure. The semiconductor body 12 of diode 2 is then connected on the anode side with the support plate 13.

There has thus been shown and described a semiconductor power switch device which fulfills all the objects and advantages sought therefor. Many changes, modifications, variations and other uses and applications of the subject invention will, however, become apparent to those skilled in the art after considering the specification and the accompanying drawing which disclose preferred embodiment thereof. All such changes, modifications, variations and other uses and applications which do not depart from the spirit and scope of the invention are deemed to be covered by the invention which is limited only by the claims which follow.

What is claimed is:

1. A semiconductor power switch device comprising:
   an asymmetrically blocking thyristor having four zones with alternating conductivity type, such that a relatively heavily n-doped layer is interposed between a p-doped outer zone and a relatively lightly n-doped zone; and
   a first diode coupled in series with said asymmetrically blocking thyristor, said diode having a predetermined structure such that the reverse recovery charge stored therein is the same as or greater than the reverse recovery charge stored in said thyristor.

2. A semiconductor power switch device according to claim 1, further comprising an auxiliary diode being connected antiparallel with said thyristor.

3. A semiconductor power switch device according to claim 1, wherein said auxiliary diode is integrated into a semiconductor body of said thyristor.

4. A semiconductor power switch device according to claim 2, wherein said auxiliary diode is integrated into the semiconductor body of said thyristor.

5. A semiconductor power switch device according to claim 2, wherein said first diode has a predetermined structure so that a greater reverse recovery charge is stored therein than in said thyristor.

6. A semiconductor power switch device according to claim 3, wherein said first diode has a predetermined structure so that a greater reverse recovery charge is stored therein than in said thyristor.

7. A semiconductor power switch device according to claim 1, wherein semiconductor bodies of said thyristor and said diode are alloyed together such that the anode side of said semiconductor body of said thyristor is contiguous to the cathode side of said semiconductor body of said diode, and a support plate is alloyed on the anode side of said semiconductor body of said diode.

8. A semiconductor power switch device according to claim 2, wherein semiconductor bodies of said thyristor and said diode are alloyed together such that the anode side of said semiconductor body of said thyristor is contiguous to the cathode side of said semiconductor body of said diode, and a support plate is alloyed on the anode side of said semiconductor body of said diode.

9. A semiconductor power switch device according to claim 3, wherein semiconductor bodies of the thyristor and the diode are alloyed together such that the anode side of said semiconductor body of said thyristor is contiguous to the cathode side of said semiconductor body of said diode, and a support plate is alloyed on the anode side of said semiconductor body of said diode.

10. A semiconductor power switch device according to claim 4, wherein semiconductor bodies of the thyristor and the diode are alloyed together such that the anode side of said semiconductor body of said thyristor is contiguous to the cathode side of said semiconductor body of said diode, and a support plate is alloyed on the anode side of said semiconductor body of said diode.

11. A semiconductor power switch device according to claim 1, wherein a semiconductor body of the thyristor is alloyed on the anode side onto one side of a support plate, and a semiconductor body of said diode is alloyed on the cathode side onto the other side of said support plate.

12. A semiconductor power switch device according to claim 2, wherein a semiconductor body of said thyristor is alloyed on the anode side onto one side of a support plate, and a semiconductor body of said first diode is alloyed on the cathode side onto the other side of said support plate.

13. A semiconductor power switch according to claim 3, wherein the semiconductor body of said thyristor is alloyed on the anode side onto one side of a support plate, and a semiconductor body of said first diode is alloyed on the cathode side onto the other side of said support plate.

14. A semiconductor power switch according to claim 4, wherein the semiconductor body of said thyristor is alloyed on the anode side onto one side of a support plate, and the semiconductor body of said first diode is alloyed on the cathode side onto the other side of said support plate.

* * * * *

UNITED STATES PATENT AND TRADEMARK OFFICE
CERTIFICATE OF CORRECTION

PATENT NO. : 4,825,272

DATED : Apr. 25, 1989

INVENTOR(S) : Erhard Lehmann

It is certified that error appears in the above-identified patent and that said Letters Patent is hereby corrected as shown below:

On the Title Page
Line Item [63]: "Ser. No. 753,200" should be -- Ser. No. 753,208 --.

In the Specification
Column 1, line 7: "Ser. No. 753,200" should be -- Ser. No. 753,208 --.

Signed and Sealed this

Twenty-sixth Day of December, 1989

Attest:

JEFFREY M. SAMUELS

Attesting Officer                Acting Commissioner of Patents and Trademarks